United States Patent
Ikeda et al.

[11] Patent Number: 6,005,329
[45] Date of Patent: Dec. 21, 1999

[54] METHOD AND APPARATUS FOR SEALING PIEZOELECTRIC RESONATOR VIA LASER WELDING

[75] Inventors: Tatsuo Ikeda; Eiji Karaki; Takuo Kuwahara, all of Nagano-ken, Japan

[73] Assignee: Seiko Epson Corporation, Tokyo, Japan

[21] Appl. No.: 08/955,463

[22] Filed: Oct. 21, 1997

Related U.S. Application Data

[62] Division of application No. 08/595,070, Feb. 1, 1996, Pat. No. 5,736,710.

[30] Foreign Application Priority Data

May 11, 1995 [JP] Japan .................................. 7-112979

[51] Int. Cl.$^6$ .............................................. H01L 41/053
[52] U.S. Cl. ........................... 310/340; 310/344; 310/348
[58] Field of Search .................................. 310/340, 344, 310/348

[56] References Cited

U.S. PATENT DOCUMENTS

| | | | |
|---|---|---|---|
| 2,454,244 | 11/1948 | Wintermute | 310/344 |
| 3,022,431 | 2/1962 | McKnight | 310/344 |
| 3,336,487 | 8/1967 | Martyn, et al. | 310/369 |
| 4,746,905 | 5/1988 | Harima et al. | 310/348 |
| 4,899,076 | 2/1990 | Kato | 310/356 |
| 5,166,570 | 11/1992 | Takahashi | 310/340 |
| 5,184,043 | 2/1993 | Yoshinaga | 310/320 |

FOREIGN PATENT DOCUMENTS

| | | |
|---|---|---|
| 45-23665 | 8/1970 | Japan ..................................... 310/348 |
| 53-75794 | 7/1978 | Japan . |
| 3-220910 | 9/1991 | Japan . |
| 4-259104 | 9/1992 | Japan . |
| 4-114222 | 10/1992 | Japan . |

*Primary Examiner*—Thomas M. Dougherty
*Attorney, Agent, or Firm*—Oliff & Berridge, PLC

[57] ABSTRACT

The case of a piezoelectric resonator in which a piezoelectric vibrator having a piezoelectric body and an electrode is flattened and a guard is provided protruding by the amount about the same as the thickness of the case on the hermetic terminal so that the open edge is received by insertion. Then the hermetic terminal in which one end of the piezoelectric vibrator is supported by the inner lead is inserted in the open edge of the case and the case is sealed by laser welding the welding area extending to the guard and to the open edge. By so doing, a thin piezoelectric resonator is provided which is desirable for surface mounting and being capable of maintaining the inside of the case in a stable vacuum state or sealed with nitrogen and the like for a long time. Moreover, by supporting the piezoelectric vibrator by the flattened inner lead inside the air tight case, a piezoelectric resonator is provided which has excellent frequency characteristics and long term aging characteristics.

11 Claims, 12 Drawing Sheets

METHOD AND APPARATUS FOR SEALING PIEZOELECTRIC RESONATOR VIA LASER WELDING

CROSS-REFERENCE TO RELATED APPLICATIONS

This is a Division of application Ser. No. 08/595,070 filed Feb. 1, 1996, now U.S. Pat. No. 5,736,710.

The present application is related to Japanese Laid-Open Patent Publication Hei 6-172686 and to Japanese Laid-Open Patent Publication Hei 7-112979, the disclosures of which are herein incorporated by reference.

BACKGROUND OF THE INVENTION

The present invention relates to piezoelectric resonator and piezoelectric resonator, and a method and an apparatus for producing the piezoelectric resonator.

DESCRIPTION OF THE RELATED ART

FIG. 20 describes a schematic internal structure of a conventional piezoelectric resonator and FIG. 21 describes a cross-section of a piezoelectric resonator. An electrode 95 is formed on a piezoelectric vibrator 94 which is housed inside the case 97 using a method such as evaporation, and the piezoelectric vibrator 94 is anchored to a support spring 93 by a conductive adhesive agent 96. The support spring 93 is welded onto an inner lead 92 of a hermetic terminal 91 and the piezoelectric vibrator 94 is made to be supported by the hermetic terminal 91. After installing the piezoelectric vibrator 94 on the hermetic terminal, frequency is adjusted and the case 97 is provided to provide cover from the top. A guard 97b of the case 97 protruding outward from the outer surface 97a of the case 97 and a guard 91a of the hermetic terminal 91 are sealed in a nitrogen atmosphere by for example a resistance welding and the like in which current is applied from both sides of the guard 97b of the case and the guard 91a of the hermetic terminal, thereby producing the piezoelectric resonator. The shape of the case 97 is non-circular with its cross section being flattened as described in FIG. 21 and the case is capable of storing the piezoelectric vibrator 94 which is approximately flat in shape.

FIG. 22 describes a condition in which the above mentioned piezoelectric resonator 90 is mounted on a substrate 99. In installing the piezoelectric resonator 90 on the substrate 99 as a surface mounting part, a metal holder 98 is pre-installed on the case 97 opposite to the guard 97b, wherein the guard 97b prevents the piezoelectric resonator 90 from tilting relative to the substrate 99.

Moreover, a chip type piezoelectric resonator which is made by sealing the contours of piezoelectric resonator 90 with resin to form a chip shape and a chip type piezoelectric resonator which is made by placing a piezoelectric vibrator in a ceramic package are examples of surface mounting parts using the piezoelectric resonator 90. In addition, there is a piezoelectric oscillator which is made to be a surface mounting component by combining an IC (integrated circuit) functioning as an oscillator with a piezoelectric resonator, both of which are anchored on the lead frame, and all of which are sealed by resin.

The overall shape of such a piezoelectric resonator is made thin by flattening the case 97 as described in FIG. 21 so that the resulting shape is suitable as a surface mounting component. However, as described in FIG. 22, the guard 97b protrudes outward from the outer surface 17a of the case and another holder must be provided to balance the guard 97b in installing such piezoelectric resonator on the substrate as a surface mounting component, which has been a factor in increasing manpower and cost. Moreover, in making the chip type piezoelectric resonator by sealing the piezoelectric resonator with resin and the like, the guard 97b also is required to be sealed and the guard 97b needs to be included in the total thickness of the chip type piezoelectric resonator. The same considerations need to be made when a piezoelectric oscillator is made by integrating a piezoelectric resonator into an IC.

Furthermore, with the above-mentioned piezoelectric resonator, the piezoelectric vibrator 94 is supported at both ends and the piezoelectric vibrator 94 is installed in the inner lead 92 of the hermetic terminal 91 by the support spring 93, as described in FIG. 20. The cost of the hermetic terminal is high and extra processing is required to insert the piezoelectric vibrator 94 between the support spring 93, causing the assembly time to be longer. Another problem exists in that the piezoelectric vibrator 94 is easily warped during sealing because the piezoelectric vibrator 94 is supported at both ends, and often fluctuation in frequency occurs.

Considering the problems described above, the present invention aims to provide a thinner piezoelectric resonator and piezoelectric oscillator with easy mounting as a piezoelectric resonator and a piezoelectric oscillator for surface mounting use. Another purpose of the present invention is to provide a method and a suitable apparatus for producing a thin piezoelectric resonator. The present invention further aims to provide a piezoelectric resonator which is easy to support, hard to fluctuate frequency, thin, inexpensive and desirable as a surface mounting component.

SUMMARY OF THE INVENTION

In order to provide an even thinner piezoelectric resonator, the present invention produces a thin piezoelectric resonator by adopting a case whose cross-section is not circular but flattened, extending the guard units from the hermetic terminal by about the same amount as the thickness of the case, maintaining air tightness within the case by welding and sealing the guard units and the open edge of the case, and eliminating components which protrude from the outer surface of the case. In short, the piezoelectric resonator of the present invention includes a piezoelectric vibrator having a piezoelectric body and an electrode, a hollow case having one edge open with a flattened cross section in which the piezoelectric resonator is housed, and a hermetic terminal which seals the open edge of the case and which leads the electrode of the piezoelectric vibrator outward of the case wherein the hermetic terminal includes an insertion unit to be inserted inside the case and a guard unit which extends from the insertion unit outward by the amount in the same manner as the approximate thickness of the case and engages an opening edge, and wherein the opening edge of the case and the guard unit of the hermetic terminal are welded together.

With the piezoelectric resonator of the present invention, the opening edge and the guard unit can be sealed by laser welding the welding area which extends over the opening edge and the guard, hence sufficient air tightness is achieved even for a case with a flattened cross-section rather than a circular shape. Moreover, due to the heat discharging effect of the guard, the effect of heat against the hermetic terminal by welding can be controlled. Because the outer diameter of the guard is larger than the inner diameter of the case, it is possible to stop the case by engaging the guard. Moreover, even when the outer diameter of the guard is larger than the outer surface of the case, it is possible to hold the amount of protrusion of the guard toward the outer surface of the case no more than about 0.5 mm or preferably no more than about 0.2 mm, which causes little problem for practical use. In this manner, the piezoelectric resonator of the present invention is able to maintain air tightness within the case without having a guard which protrudes from the outer surface of the case. Hence, the piezoelectric resonator of the present invention does not have a component which protrudes further than the outer dimensions of the case, enabling close adherence of the case to the substrate when the piezoelectric resonator is mounted on the surface. Therefore, with the piezoelectric resonator of the present invention, the actual mounting thickness may be reduced, in addition, expense related to mounting may be reduced because separate components such as a holder and the like are not needed for mounting. Moreover, in making a chip type piezoelectric resonator by sealing with resin the piezoelectric resonator of the present invention or in composing a piezoelectric oscillator by combining an IC chip with a lead frame, the thickness of the guard protruding from the outer surface of the case needs not be taken into consideration, hence an even thinner chip type piezoelectric resonator and piezoelectric oscillator which are better suited for surface mounting components may be provided.

Since the piezoelectric resonator of the present invention does not have a guard in the opening edge of the case, the space between the opening edge and the guard of the hermetic terminal should be made as small as possible when inserting the hermetic terminal into the opening edge of the case. On the other hand, the guard in the hermetic terminal is molded in a press and the like, and the guard cannot be formed with a vertical surface relative to the insertion unit but the contacting component with the insertion unit becomes a curved surface. Hence in the piezoelectric resonator of the present invention, by beveling the opening edge of the case inwardly, the space between the tip of the opening edge and the guard unit of the hermetic terminal is made smaller to enable easy welding.

As for the hermetic terminal, the insertion unit is composed of a metal outer ring, from which a guard protrudes, and a lead is provided inside the metal outer ring extending from inside to outside of the case through the hermetic terminal in order to connect the piezoelectric vibrator which is housed inside the case to an external circuit, and the section where the lead goes through the hermetic terminal may be sealed, at the same time a glass insulation unit may be provided to insulate the lead against the hermetic terminal. In order to maintain air tightness in the area where the insulation unit and the hermetic terminal make contact, the metal outer ring may preferably be made of at least one of covar, Fe-Ni alloy and SUS with the nearly same heat expansion rate as glass. Similarly, the lead is also preferably made of at least one of covar, Fe-Ni alloy and SUS with nearly the same heat expansion rate as glass. Moreover, in order to maintain air tightness between the metal outer ring and the case, the case may preferably be made of material with nearly the same heat expansion rate as glass such as at least one of covar, Fe-Ni alloy and SUS.

In the piezoelectric resonator of the present invention, weldability between the opening edge and the guard of the hermetic terminal is very important in order to maintain the air tightness within the case. Laser welding is ideal for welding of small elements such as the piezoelectric resonator in the present invention and the weldability may be improved by electrolysis plating treatment in the welding area extending the opening edge and the guard. For the electrolysis plating treatment, an electrolysis Ni plating or Au plating on top of the electrolysis Ni plating treatment is preferred, and soderability can be improved by performing an electrolysis Ni plating or Au plating on top of the electrolysis Ni plating treatment on the outer surface of the case and the guard. Moreover, by performing electrolysis plating on the inner surface of the case, the generation of gas after welding can be controlled.

Moreover, by supporting one side of the piezoelectric vibrator with the hermetic terminal by a conductive adhesive agent, the assembly process becomes simple and warp is difficult to generate after the assembly, enabling control of the frequency fluctuation. Furthermore, by flattening the side of the electrode of the piezoelectric vibrator provided in the hermetic terminal extending toward the piezoelectric vibrator of the lead which is led from the case outward, connection with the piezoelectric vibrator becomes easy and connective strength also improves. Moreover, the piezoelectric vibrator can be supported near the center of the case, enabling the increase in oblateness of the case without inconvenience, such as the piezoelectric vibrator making contact with the case and the like.

The oblateness of the cross-section of the case and the hermetic terminal (the ratio of the short side to the long side) can be made in the range of about 40–60%, and because the guard is not spread from the case outward, a thin piezoelectric resonator suitable for surface mounting can be provided.

It is important for the piezoelectric resonator of the present invention to improve the quality of welding between the opening edge of the case and the hermetic terminal in order to maintain the air tightness. However, because the case and the hermetic terminal are flattened in the piezoelectric resonator of the present invention, if the case is simply rotated around its central axis, the distance between the open edge and the laser head varies and stable laser welding cannot be achieved. Hence, in the method of producing the piezoelectric resonator in the present invention, the intensity of the laser beam to be irradiated on the welding area is maintained almost constant by controlling the relative position of the laser head with respect to the piezoelectric resonator with rotation of the piezoelectric resonator relative to the laser head and with linear movement of the laser head interlocking the rotational control during irradiation of laser beam on the welding area extending the opening edge and the guard in the process of laser welding.

In order to perform uniform welding, controlling of the relative position between the laser head and the piezoelectric resonator is considered so that the laser beam is irradiated nearly perpendicularly onto the welding surface, that the distance between the laser head and the welding area is maintained nearly constant, and that the velocity with which the spot of the laser beam passes the welding area is maintained nearly constant. To do this, it is possible to control the rotational velocity for rotational control by alternately or simultaneously executing the rotational control and the linear movement control. By the above-mentioned controls, the spot diameter of the laser beam in the welding area can be maintained nearly constant and the motion velocity of the spot of the laser beam can be maintained nearly constant, resulting in uniform welding while irradiating the laser beam with constant intensity from the laser head. Hence, uneven welding is minimized and uniform quality is achieved, sealing failure is eliminated, and a resonator with high degree of oscillating frequency accuracy and superior aging characteristic can be provided.

An apparatus for producing a piezoelectric resonator wherein a hermetic terminal is inserted in a hollow case with a flattened cross section in which a piezoelectric vibrator is housed, and including a chuck capable of holding the piezoelectric resonator while the guard extending outward from the insertion unit of the hermetic terminal and the opening edge are nearly in contact, a laser head which irradiates the laser beam on the welding area extending to the guard and to the opening edge of the case being held by the chuck, and a driving mechanism which performs the operation of rotating the laser head relative to the piezoelectric resonator during laser welding and the operation to move the laser head linearly relative to and interlocking with the piezoelectric resonator is desirable for producing a piezoelectric resonator.

In addition, a vacuum chamber can be provided to house the chuck and the piezoelectric resonator, and by irradiating the laser beam through glass which includes a transmission wall which is transparent with respect to the laser bean in the vacuum chamber, the piezoelectric resonator whose piezoelectric vibrator is vacuum sealed inside the case can be produced.

Moreover, by providing a magnetic force suction unit to maintain the case against the chuck, the piezoelectric resonator is maintained solidly, enabling an improvement in welding quality. Similarly, it is also favorable to provide a vacuum suction unit on the chuck to maintain the case, or a holding unit to grab one side of the case and a press unit to press the piezoelectric resonator toward the holding unit from the back of the holding unit can be provided in the chuck.

DESCRIPTION OF THE PREFERRED EMBODIMENT

A Piezoelectric Resonator and a Piezoelectric Oscillator

Figure 1:
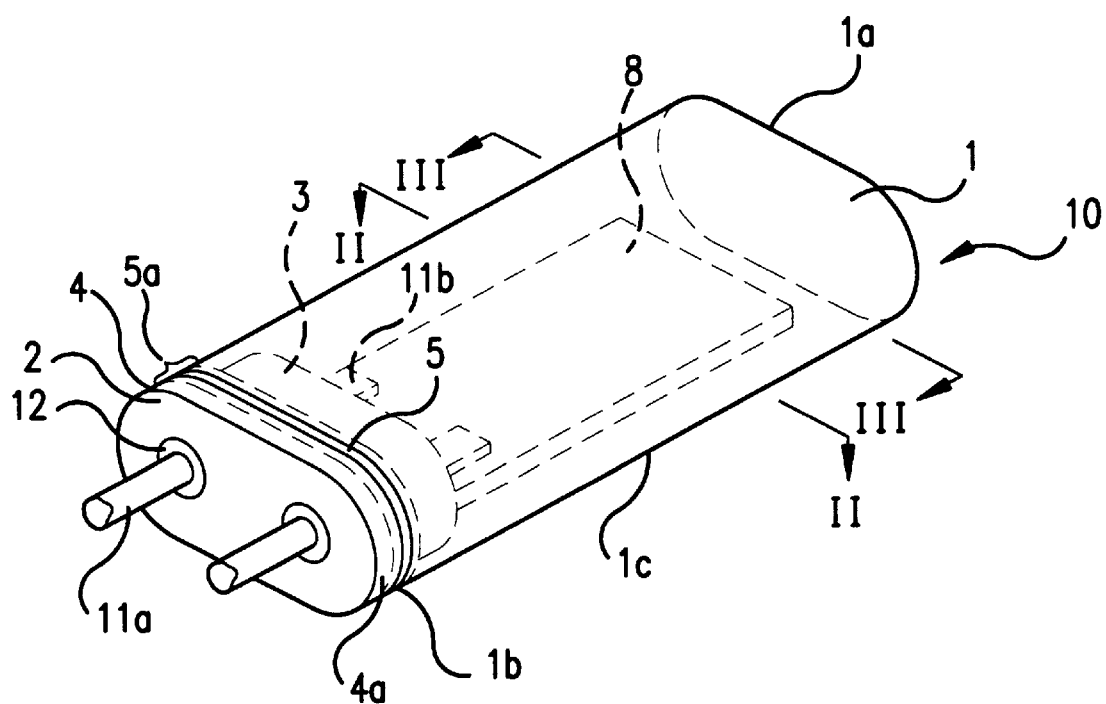
FIG. 1 is an oblique view describing a schematic structure of the piezoelectric resonator in the embodiment of the present invention.
Figures 2A, 2B:
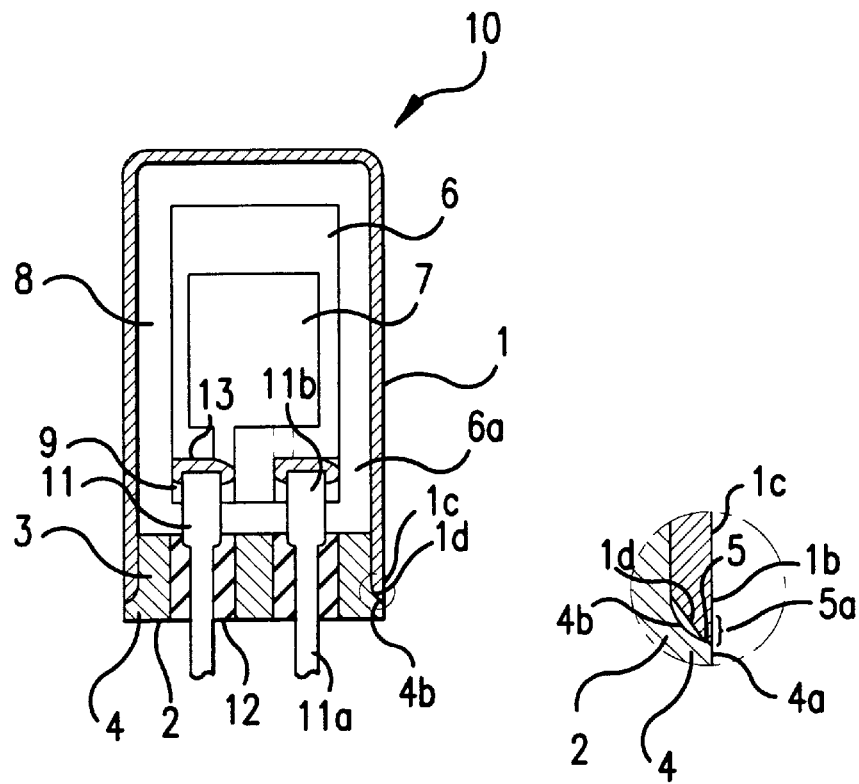
FIGS. 2A–2B show a cross-section describing the structure of the piezoelectric resonator in FIG. 1.

An embodiment of the present invention will be described hereafter with reference to the drawings. FIG. 1 describes a schematic structure of the piezoelectric resonator 10 of the present invention. Also FIGS. 2A–2B show a vertical cross section of the piezoelectric resonator 10 of the present embodiment, and FIG. 3 describes a horizontal cross section of the piezoelectric resonator of the present embodiment viewed from the opposite side of the hermetic terminal which will be described later.

Figure 3:
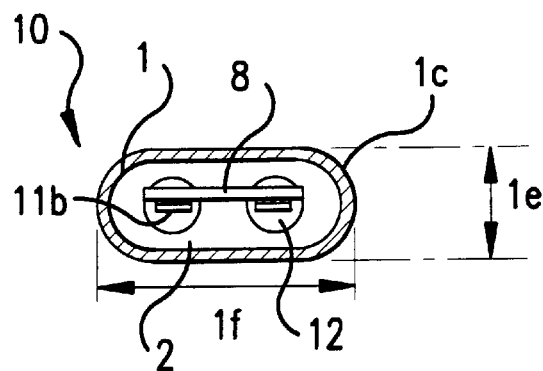
FIG. 3 is a drawing describing a cross-section of a case for the piezoelectric resonator in FIG. 1.

The piezoelectric resonator of the present embodiment includes a hollow metal case 1 whose cross section is a flattened elliptic shape rather than a circular shape as described in FIG. 3. The case 1 is longer in the vertical direction and the top section 1a is sealed while the opposite bottom section 1b is left open. A hermetic terminal 2 which also has the shape of a near flattened ellipse like the inside of the case 1 is inserted into the open edge 1b of the case 1. The top section of the hermetic terminal 2 is an insertion unit 3 which is shaped to enable the insertion into the inside of the case 1 with the unit nearly completely adhering to the case 1 and a guard 4 is formed at the bottom section of the insertion unit 3 extending from the insertion unit 3 toward the outer surface 1c of the case 1. With the piezoelectric resonator 10 of the present embodiment, the guard 4 can be made to protrude from the insertion unit 3 outward about the same amount as the thickness of the case. For example, the amount of the protrusion of the outer surface 4a of the guard 4 relative to the outer surface 1c of the case 1 may be made within approximately 0.5 mm, or preferably within approximately 0.2 mm, and when the hermetic terminal 2 is inserted into the open edge 1b of the case 1, the guard engages in and stops the open edge 1b with the outer surface 4a of the guard 4 not protruding much from the outer surface 1c of the case outward to cause any practical problems. The case 1 and the hermetic terminal 2 are anchored by laser welding 5 with a laser beam which is irradiated on the welding area 5a extending to the open edge 1b and the guard 4 while the insertion unit 3 of the hermetic terminal 2 is inserted inside the case 1 from the open edge 1b of the case 1, and are assembled with the inside of the case being sealed completely. The insertion unit 3 of the hermetic terminal 2 of the present embodiment is made to be a metal outer ring (hereafter a metal outer ring 3) with a portion of the outer surface protruding to form a guard 4.

A piezoelectric vibrator 8 with an electrode 7 which is formed on both sides of the board shape piezoelectric body 6 such as a crystal piece by, for example, evaporation is housed inside the case 1. The piezoelectric vibrator 8 of the present embodiment is formed in such a manner that the electrode 7 which is formed on both sides of the piezoelectric body 6 for oscillation is led to one edge of the piezoelectric body 6, which is the bottom edge 6a in the present embodiment, to form electrodes 9 for connection, and these electrodes 9 are attached onto the lead 11 running through the hermetic terminal by the conductive adhesive agent 13 and the like. The lead 11 of the present embodiment is formed in such a manner that the outer lead 11a extending from the hermetic terminal 2 outward is a rod shape and the inner lead extending inward to the piezoelectric vibrator is a flattened board shape. Hence, the inner lead 11b is made to be sealed on the connection electrodes 9 of the piezoelectric vibrator 8 by a conductive adhesive agent 13 and the like. Moreover, with the piezoelectric resonator of the present embodiment, one end of the piezoelectric vibrator 8 is supported by the lead 11b, making it easy to attach to the lead 11b. Moreover, by supporting one end of the piezoelectric vibrator 8 by the lead 11b, warping of the piezoelectric body 6 is avoided. Furthermore, by making the inner lead 11b to be flattened, the piezoelectric vibrator 8 can be placed in the central section of the case 1, enabling housing of piezoelectric vibrator 8 in the case 1 with large oblateness without causing the piezoelectric vibrator 8 to contact with the case 1. Hence, it is possible to make the piezoelectric resonator 10 even thinner by adopting a flattened inner lead.

The piezoelectric resonator 10 of the present embodiment is made to maintain the inside of the case 1 in a vacuum state or state in which inactive gas such as nitrogen is sealed so that the piezoelectric vibrator with frequency adjustment oscillates in stable manner, ensuring the oscillation with superior frequency characteristics. Moreover, by sealing the case 1, long term aging characteristics of the piezoelectric vibrator is improved. For this purpose, the guard 4 is provided in the hermetic terminal 2 to engage in and stop the open edge 1b of the case 1 and the guard 4 and the open edge 1b are sealed with laser welding 5. Hence, with the piezoelectric resonator of the present embodiment, it is essential to ensure the execution of high quality welding 5 and several techniques are introduced for this purpose. First of all, the metal outer ring of the hermetic terminal 2 of the present embodiment is made of metal and the metal outer ring 3 and the guard 4 are formed to have the above-mentioned shape by pressing. Hence, the guard 4 is formed in such manner that the guard 4 protrudes from the metal outer ring 3 with a curved surface 4b with R rather than protruding from the metal outer ring 3 with a vertical surface. Hence, in the piezoelectric resonator 10 of the present embodiment, bevelling 1d is performed on the open edge 1b of the case 1 inwardly to prevent interference of the curved surface 4b of the guard and the open edge 1b and to enable the insertion of the metal outer ring 3 of the hermetic terminal 2 into the case 1 to the point that the open edge 1b nearly touches the guard 4 of the hermetic terminal 2. Hence, it is possible to minimize the space between the open edge 1b and the guard 4 and when the space is sealed by laser welding in which the laser beam is irradiated along the welding area 5a, the open edge 1b and the guard is solidly anchored and completely sealed. Bevelling 1d to be provided on the open edge 1b may be either R-bevelling with a curved surface or a C-bevelling with a flat surface as long as bevelling 1d is larger than R of the curved surface 4b so that it does not interfere with the curved surface 4b of the guard.

Moreover, with the piezoelectric resonator 10 of the present embodiment, in order to maintain the air tightness of the case 1, a glass insulating unit 12 is provided in the contact section of the lead 11 which runs through the metal outer ring 3, ensuring air tightness as well as electric insulation between the lead 11 and the metal outer ring 3. Moreover, if warping occurs on the contact section of the insulating unit 12 and the metal outer ring 3 and air tightness fails, it becomes impossible also to maintain air tightness inside the case 1. Hence, the metal outer ring 3 of the piezoelectric resonator 10 in the present embodiment is made of one of the materials comprising covar, Fe-Ni alloy and SUS. These metals such as covar, Fe-Ni alloy and SUS have nearly the same heat expansion coefficient as glass, hence, it becomes possible to match the heat expansion coefficient of the metal outer ring 3 with that of the glass insulating unit 12. Thus, it becomes possible to prevent the occurrence of a space between the glass insulator 12 and the metal outer ring 3 due to changes in temperature, ensuring the maintenance of the internal state of the case 1, that is to say, maintenance of the vacuum state or state in which nitrogen gas and the like is sealed inside the case 1.

Similarly, the lead 11 may preferably made of one of the materials comprising covar, Fe-Ni alloy or SUS to ensure the heat expansion coefficient of the lead 11 and the insulating unit 12 to be about the same. Moreover, the case 1 is made of one of the materials from covar, Fe-Ni alloy of SUS in the piezoelectric resonator 10 of the present embodiment so that the heat expansion coefficients of the hermetic terminal 2 and the case 1 are virtually the same. By selecting these materials the heat expansion coefficients of the lead 11, the glass insulation unit 12 and the metal outer ring 3 can be maintained about the same, hence, the possibility of leaking from the space between these is made small, and the warping of the welding 5 is made insignificant. Hence, the air tightness of the case 1 is maintained and the internal state of the case 1 is maintained constant.

Moreover, with the piezoelectric resonator 10 of the present embodiment, electrolysis plating is performed on the welding area 5a to which the laser beam is irradiated to improve weldability by the laser beam, enabling welding with uniform quality. For metals for performing electrolysis plating to improve weldability, any of the metals from nickel, gold, silver, copper, chrome, titan, platinum, palladium and alloy thereof, including nickel-palladium alloy, nickel-gold-indium alloy and cobalt-gold alloy may be used. Out of these metals, nickel is most commonly used and in the present embodiment, the guard 4 of the metal outer ring 3 and the open edge 4b of the case 1 are treated with electrolysis Ni plating. Moreover, by performing AU plating on top of the electrolysis Ni plating, the weldability may further be improved.

Moreover, with the piezoelectric resonator 10 of the present embodiment, the region of electrolysis Ni plating is expanded to include the outer surface and the inner surface of the case 1 and the guard 4. By performing electrolysis Ni plating on the outer surface of the case 1 and the guard 4, the soderability of the case 1 is also improved. Furthermore, Au plating may be performed on top of the electrolysis plating. Similarly, the outer lead 11a of the hermetic terminal 2 may be treated with electrolysis Ni plating or treated with Au plating on top of the electrolysis Ni plating to improve soderability.

In addition, it is possible to treat the inner surface of case 1 as well as the surface of the metal outer ring 3 with electrolysis plating. By performing Au plating on top of the electrolysis Ni plating, it is possible to reduce the amount of absorption of the gas. By reducing the amount of gas absorption within case 1 and on the surface of the metal outer ring, the amount of gas generated within the case 1 after sealing for air tightness may be reduced, enabling prevention beforehand of problems such as frequency fluctuation due to absorption of gas by the piezoelectric vibrator within the case 1.

In this manner, the piezoelectric resonator of the present embodiment may increase sealability by eliminating welding failure through performing electrolysis Ni plating and may maintain the inner environment of case 1 constant such as in a vacuum state, hence, the frequency fluctuation of the piezoelectric vibrator is controlled, thereby providing a piezoelectric resonator 10 with better accuracy.

Here, it is possible to perform non-electrolysis Ni-plating to either the case 1 or the metal outer ring 3 and to perform electrolysis plating on the other, but due to differences between the fusing point of Ni in such combination, the strength of sealing deteriorates during welding and the air tightness cannot be maintained for a long time, which is not desirable. Moreover, due to the precipitation of phosphate P included in non-electrolysis plating, leaking occurs after welding, making a use of non-electrolysis plating undesirable. Hence, in order to ensure complete welding and strong sealing of the open edge 1b of the case 1 and the guard 4 of the metal outer ring 3, it is desirable to perform electrolysis Ni plating at least on the welding area 5a before performing laser welding thereof.

The piezoelectric resonator 10 of the present embodiment, differing from a piezoelectric resonator in the prior art wherein a guard is provided in the case and the guard is layered with the guard provided in the hermetic terminal to be anchored by resistance welding, the guard is not provided in the case 1 and the guard 4 of the hermetic terminal 2 is arranged so that the guard is placed on the same position as the outer surface 1c of the case 1 or inside of the outer surface 1c of the case 1. Because the guard is short it can be completely sealed by laser welding. Moreover, the guard 4, though it is short, is provided and releases heat from the welding. Hence, the effect of the heat on the glass insulation unit 12 which seals the lead 11 is prevented, enabling a production of a piezoelectric resonator 10 with a high level of air tightness.

Moreover, in a case whose cross section is flattened, unlike the case with a circular cross section, maintenance of air tightness is difficult due to uneven pressure on the fitting component even if the outside dimension of the hermetic terminal and the inside dimension of the case are set to fit each other. However, with the piezoelectric resonator 10 of the present embodiment, the case 1 and the hermetic terminal 2 are sealed by laser welding, hence, air tightness is maintained for a long period of time even for a piezoelectric resonator using a case with any shape of cross section.

Moreover, because there is no component protruding outward from the outer surface 1c of the case 1 during the laser welding 5, the size of the piezoelectric resonator 10 remains smaller than or equal to the outside dimension of the case 1 after welding, resulting in an even thinner piezoelectric resonator 10 which is desirable for surface mounting. To do this, it is indispensable to perform stable and good quality welding between the open edge 1b and the guard 4 in addition to techniques for maintaining the air tightness described above. Particularly a technique is required to cope with a flattened case 1 for the piezoelectric resonator 10 of the present invention, which will be described later in detail.

Figure 4:
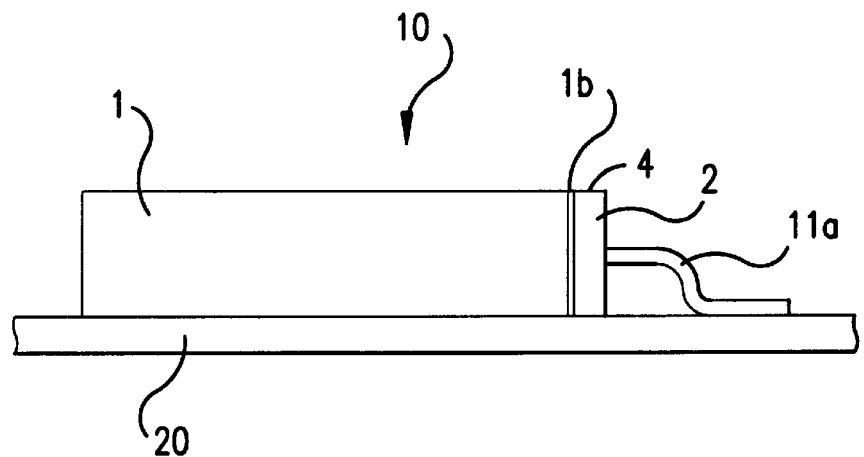
FIG. 4 is a side view describing mounting of the piezoelectric resonator in FIG. 1 onto the substrate.

FIG. 4 describes a state wherein the outer lead 11a of the piezoelectric resonator 10 in the present embodiment is bent into a hook shape and is anchored horizontally on the substrate 20. With the piezoelectric resonator 10 of the present embodiment, the case 1 can be adhered and mounted on the substrate 20 in the above manner, and it is possible to attach it to the substrate without using a special jig such as a holder for surface mounting. The piezoelectric resonator 10 of the present embodiment seals inside of the case 1 by welding the open edge 1b of the case 1 and a short guard 4 provided in the hermetic terminal 2 without providing the guard in the case 1 side. Hence, the case 1 and the hermetic terminal 2 are easily assembled, and the piezoelectric resonator 10 with stable oscillation and a high level of accuracy is produced as a surface mounting device which is thin, stable and easily attached on the substrate 20 as it is without using a holder and the like.

Moreover, with the piezoelectric resonator of the present embodiment, one side of the piezoelectric vibrator 8 is held by the lead 11 in the case 1. Hence, the occurrence of warping in the piezoelectric vibrator 8 after sealing is prevented. Thus the effect of warping resulting from sealing the piezoelectric vibrator in the case is slight and the fluctuation in the frequency during sealing by setting the frequency and after the sealing can be made small. Moreover, desirable long term aging characteristics are achieved.

Also, the tip of the inner lead 11b is flattened and formed into board shape as described in FIG. 3, and the piezoelectric vibrator 8 can be solidly anchored on the lead 11. Hence, the fluctuation in frequency due to the changing of the connection between the piezoelectric vibrator 8 and the lead 11 after sealing is prevented and stable oscillation is achieved. Moreover, the connection resistance between the connection electrode 9 and the lead 11 described in FIG. 2 can be made small, resulting in a piezoelectric resonator having excellent characteristics. In addition, by flattening the inner lead 11b, the piezoelectric vibrator can be housed in the case 1 with much room, and the capacity of the case 1 can be effectively utilized such as housing a piezoelectric vibrator with a substantial thickness inside the thin case 1.

As described above, the piezoelectric resonator 10 of the present embodiment has excellent oscillation characteristics, and the piezoelectric resonator 10 whose case 1 is flattened to make the overall thickness thin is provided as a thinner and easier-to-use surface mounting component. The cross section of the case 1 of the present embodiment is flattened to form a nearly elliptic shape rather than a circular shape as described in FIG. 3, and semicircles are added to both ends of the rectangular in the lengthwise direction. Defining the oblateness as the ratio of the minimum outer diameter and the maximum outer diameter, the oblateness of the case 1 of the present embodiment is set no more than approximately 60% in order to securely mount and anchor the piezoelectric resonator 10 onto the substrate 20 by housing a piezoelectric vibrator 8 in a small case 1 with the short side 1e no more than about 2.0 mm and the long side 1f no more than approximately 3.5 mm to produce a thin and small piezoelectric resonator 10.

As described above, with the piezoelectric resonator 10 of the present embodiment, the long side 1f can be made no larger than about 3.5 mm, and is sufficiently small compared to the conventional ceramic package type piezoelectric resonator which is a square of about 4.5 mm per side.

Moreover, the dimensions of the cross section of the case 1 are not limited to the above dimensions and the length of the long side can be made even shorter, for example. However, if the long side 1f becomes shorter than about 2 mm, the width of the piezoelectric vibrator 8 whose surface is near rectangular becomes too small and the region in which the electrode 7 and 9 are formed becomes small. Hence, the dimensions of the electrode become insufficient, causing the resistance value (CI value) to increase and the maintenance of excellent characteristics becomes difficult. Hence, the long side 1f of the cross section of the case 1 should preferably be no less than about 2 mm.

Moreover, with the piezoelectric resonator 10 of the present embodiment, the short side 1e of the cross section of the case 1 is set at about 2 mm to make the thickness of the surface mounted piezoelectric resonator 10 to be about the same as a conventional ceramic package type piezoelectric resonator. The piezoelectric vibrator 8 is made sufficiently thin with respect to the case 1, hence it is possible to make the short side 1e of the case 1 even shorter. Moreover, with the piezoelectric resonator 10 of the present embodiment, the piezoelectric vibrator 8 is anchored by making the shape of the inner lead 11b nearly flat, hence, the inner capacity of the case 1 is effectively utilized and the piezoelectric vibrator 8 and the lead 11b can be housed without touching each other inside the thin case 1 with the small short side 1e. For example, if the piezoelectric vibrator 8 is an AT resonator, the thickness varies with frequency but because even a thick piezoelectric vibrator with about 4 MHz oscillation frequency has a thickness of about 0.4 mm, it can sufficiently be housed inside the thin case 1 having a thickness about 0.2 mm by making the shape of the inner lead 11b flat and thin instead of a round rod shape.

However, unless the short side 1e is more than or equal to approximately ⅖ of the long side 1f, or unless the oblateness is more than about 40%, the production of the hermetic terminal 2 becomes difficult. Hence, the short side 1e should preferably be more than about 0.8 mm to satisfy the relational state with the long side described above. Moreover, it is desirable to maintain the oblateness of the short side 1e to be from approximately 40% to 60% in relation to the long side 1f.

Figure 5A:
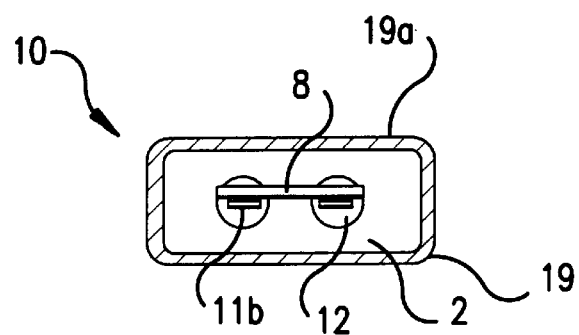
FIG. 5A is a drawing describing a cross section of the piezoelectric resonator having a case with different shape from the piezoelectric resonator in FIG. 3.

Also, it is clear that the shape of the case for the piezoelectric resonator 10 of the present invention is not limited to the above shapes but any shape is possible as long as the one side of the cross section of the case is shorter than the other side. For example, it is possible to adopt the case 19 with flattened cross section having a (four-way angle) 19a, whose cross section is almost a rectangle, to be a curved surface as shown in FIG. 5A. In the case 19 described above, the curvature R of the four-way angle 19a becomes small, causing the weldability to decline slightly, but because the inner capacity becomes large, dispersion is easily absorbed in assembling the piezoelectric vibrator 8 and the contact between the piezoelectric vibrator 8 and the case is prevented even with the occurrence of small errors. Moreover, because there is a linear unit in the short side direction, it is easily grabbed, making it easier to determine the position during mounting.

Figure 5B:
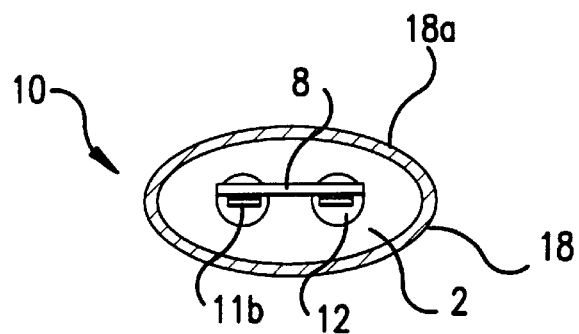
FIG. 5B is a drawing describing a cross-section of the piezoelectric resonator with yet another shape.

Furthermore, it is possible to adopt a case 18 having a cross section 18a which is flattened to become nearly elliptical as shown in FIG. 5B. By producing a case which is flattened with a continuously curved surface, pressure balance is easily obtained between the hermetic terminal and the case 18 while the hermetic terminal is being fitted in the case 18, enabling the providing of a piezoelectric resonator with a higher level of air tightness. The case with flattened cross section is not limited to the above examples, but the cases with an approximately trapezoidal or parallelogram cross section are also acceptable.

Moreover, the piezoelectric resonator 10 of the present invention is made thinner with a flattened case 1 and the guard does not protrude outward. Hence, the piezoelectric resonator 22 can be made thin when the chip type piezoelectric resonator 22 is made by sealing the piezoelectric resonator 10 with resin.

Figure 6:
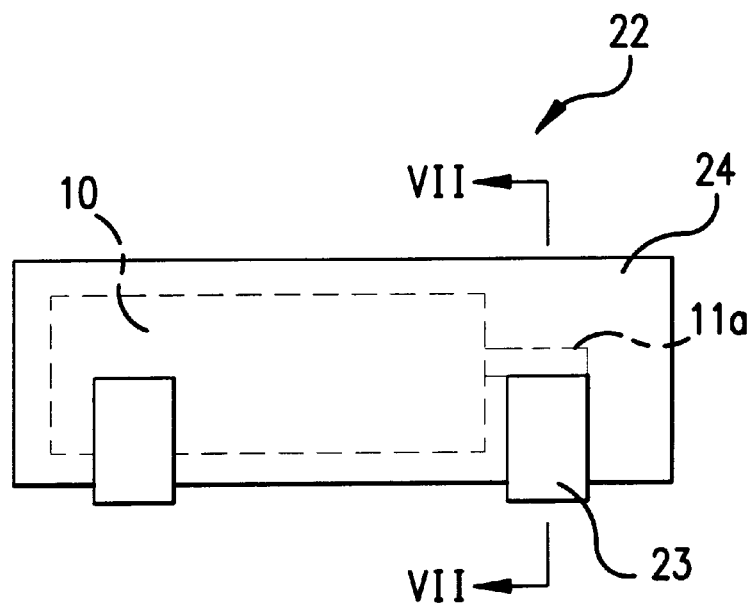
FIG. 6 is a side view of a chip type piezoelectric resonator formed by using a piezoelectric resonator in FIG. 1.
Figure 7:
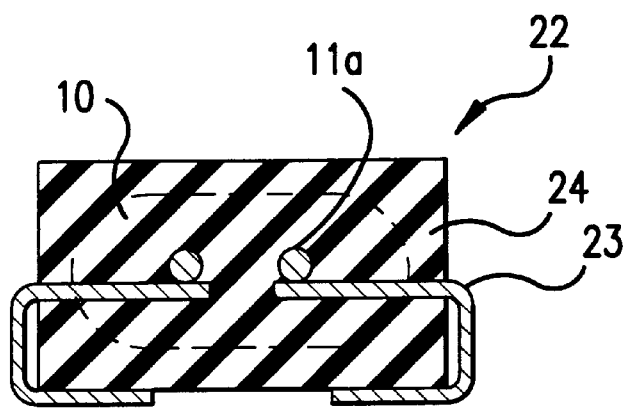
FIG. 7 is a cross-section describing a structure of the chip type piezoelectric resonator in FIG. 6.

FIG. 6 describes a side view of the chip type piezoelectric resonator 22 of the present embodiment and FIG. 7 describes a structure of the lead section of the chip type piezoelectric resonator 22 using its cross section. With the chip type piezoelectric resonator 22, the outer lead 11a protruding outward from the hermetic terminal 2 of the piezoelectric resonator 10 is anchored on the lead frame 23, and the entirety of the piezoelectric resonator 10 including the outside panel of the case 1 of the piezoelectric resonator 10 and the outer lead 11a is molded into a chip by sealing with resin 24, and then by bending the lead frame 23 along the contour of the resin 24 to form a chip type piezoelectric resonator 22. Sealing of the piezoelectric resonator 11 with resin 24 causes production costs to increase slightly but by molding it into a chip shape, it becomes easy to handle and compatibility with other ceramic package resonators is secured. Moreover, with the chip type piezoelectric resonator 22 of the present invention, case 1 can be made thinner and the resin 24 to cover the contour can be made thinner because there is no guard protruding from the case 1. Hence, a chip type piezoelectric resonator 22 thinner than conventional piezoelectric resonator can be provided.

Figure 8:
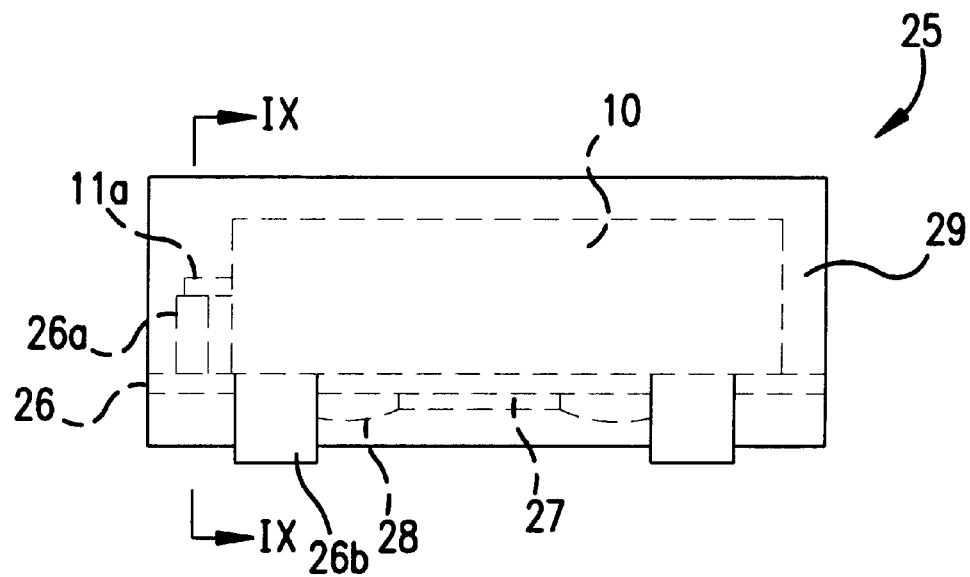
FIG. 8 is a side view of a piezoelectric oscillator composed of a piezoelectric resonator in FIG. 1.
Figure 9:
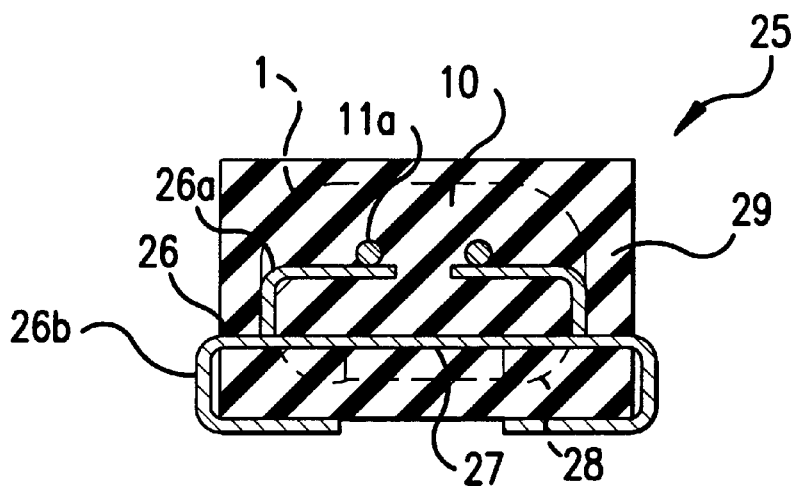
FIG. 9 is a cross-section describing a structure of the piezoelectric oscillator in FIG. 8.

Similarly, it is possible to make a product thinner even when the piezoelectric resonator of the present invention is combined with an IC with an oscillating circuit to create a piezoelectric oscillator. FIG. 8 shows a side view of the piezoelectric oscillator 25 of the present invention, while FIG. 9 shows its cross section.

The IC chip 27 integrated together with the piezoelectric resonator of the present embodiment has a built-in amplifier and the like to oscillate the piezoelectric resonator 10 with the function of outputting oscillation frequency. Moreover, it is possible to install, if necessary, a divider to divide the oscillating frequency and the PLL (phase locked loop) circuit in the IC chip 27, or to simultaneously mount another IC chip with the above functions inside the piezoelectric oscillator 25.

In the piezoelectric oscillator 25 of the present embodiment, the IC chip 27 is anchored on one side of the lead frame 26 and the IC chip 27 is connected to the lead frame 26 by a wire bonding line 28. Moreover, the above-mentioned piezoelectric resonator 10 is attached onto the other side of the lead frame 26 and the outer lead 11a protruding from the hermetic terminal 2 is anchored by welding and the like onto the lead 26a which is erected from the lead frame 26. It is possible to anchor by bending the outer lead 11a of the piezoelectric resonator 10 onto the lead frame 26 instead of providing a lead frame 26. Moreover, in anchoring the piezoelectric resonator 10 onto the lead frame 26, case 1 can be connected to one of the lead 26b extending outward from the lead frame 26 so that the case 1 may be grounded.

Here, it is obvious that the method of packaging the piezoelectric resonator 10 of the present embodiment with both the IC chip 27 and the lead frame 26 is not limited to above examples. For example, the component 26a erected from the lead frame 26 is not necessary if the piezoelectric resonator described in FIG. 4 is used.

The piezoelectric resonator 10 and the lead frame 26 connecting the IC chip 27 are set in a mold and the whole thing is sealed by powering epoxy type resin. Then the unnecessary components of the lead frame 26 are trimmed off by a press and the piezoelectric oscillator 25 is produced by bending the lead 26b extending outwardly from the lead frame 26. With such a piezoelectric oscillator 25 according to the present invention, the piezoelectric resonator 10 sealed with the IC chip 27 with resin is thin, and even if the IC chip 27 is layered, the entire product is thin because there is not a part protruding from the outer surface of the case 1 such as a guard, thereby providing a small and thin piezoelectric oscillator 25.

A Production Method and a Production Apparatus

As described in FIG. 1 through FIG. 3, with the piezoelectric resonator 10 of the present invention the hermetic terminal 2 is inserted in the open edge 1b of the case 1 and the open edge 1b and the guard 4 of the hermetic terminal 2 are welded to maintain the air tightness of the interior of the case 1. The inside of the case 1 is in a vacuum state or is filled with an inactive gas such as nitrogen in order to stabilize the oscillation characteristics of the piezoelectric resonator 10 and to prevent deterioration due to aging, and stable oscillating characteristics are obtained by maintaining this state. Moreover, with the piezoelectric resonator 10 of the present invention, a guard which protrudes from case 1 outwardly is not provided but the guard 4 of the hermetic terminal 2 which expands to the vicinity of the outer surface of the case 1 is used to hold the open edge 1b and the contact section of these are welded to make the piezoelectric resonator 10 even thinner as a surface mounting component. Hence, with the piezoelectric resonator 10 of the present invention, it is important to perform high quality welding for the open edge 1b of the case 1 and the guard 4 of the hermetic terminal 2 to ensure complete air tightness.

Figure 10:
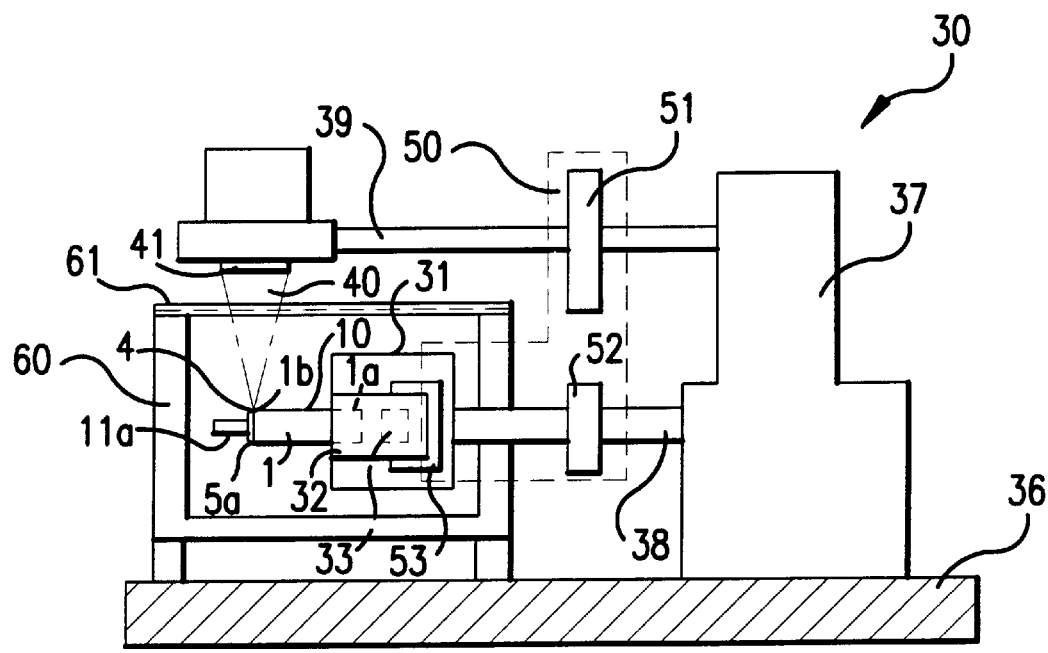
FIG. 10 is a drawing describing a schematic structure of a production apparatus ideal for welding the piezoelectric resonator in FIG. 1.

FIG. 10 describes a schematic structure of a production apparatus of the present invention which performs the laser welding of the case 1 of the piezoelectric resonator 10 to the hermetic terminal 2. As explained above, the dimensions of the case 1 of the piezoelectric resonator 10 are small with a long side of about 3 mm and a short side of about 2 mm, and the laser welding in which laser light is irradiated to weld the surrounding is a desired method. For this purpose, the production apparatus 30 of the present embodiment includes a chuck 31 to grab the top portion 1a of the case 1 of the piezoelectric resonator 10, and a laser head 41 which irradiates a laser beam 40 on the welding area 5a of the case 1 of the piezoelectric resonator 10 which is grabbed. Then, the laser beam 40 is irradiated along the welding area 5a by rotating the chuck 31 to weld the open edge 1b and the guard 4.

Figure 12A:
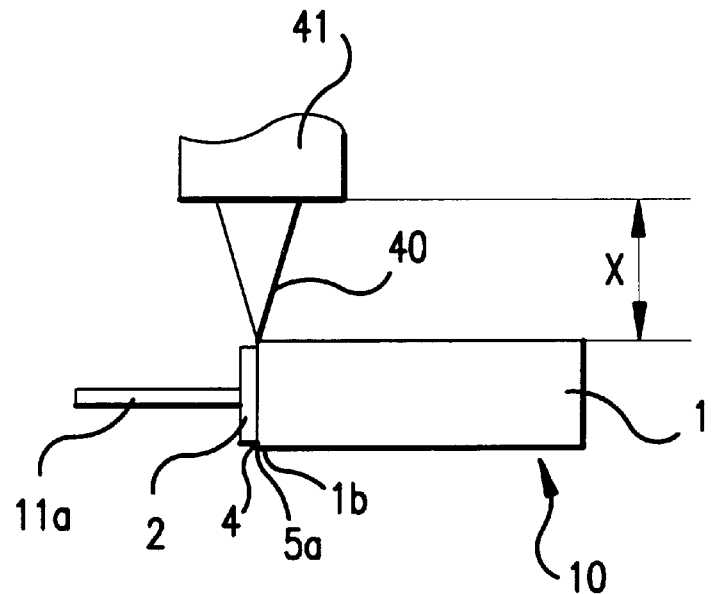
FIG. 12A is a side view describing a condition of laser welding the piezoelectric resonator.
Figure 12B:
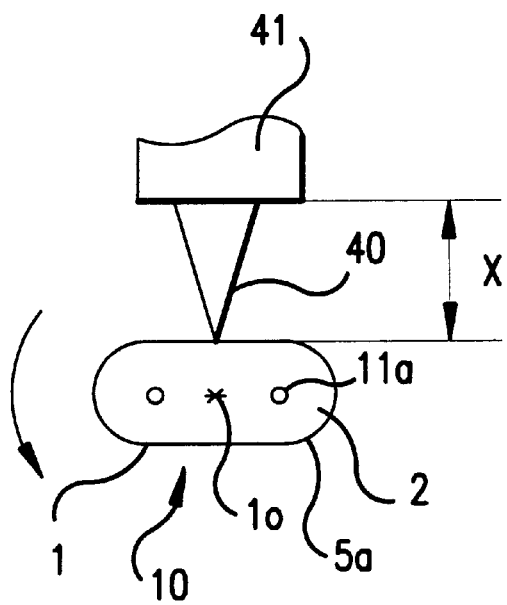
FIG. 12B is a drawing describing a condition of laser welding the piezoelectric resonator viewed from the adherence terminal side of the piezoelectric resonator.
Figure 13:
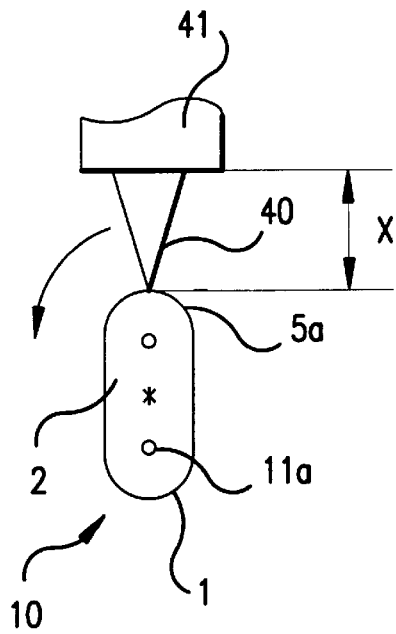
FIG. 13 is a drawing describing the change of the size of the laser beam spot in the connection section to be welded during the process of laser welding in FIG. 12.
Figure 14:
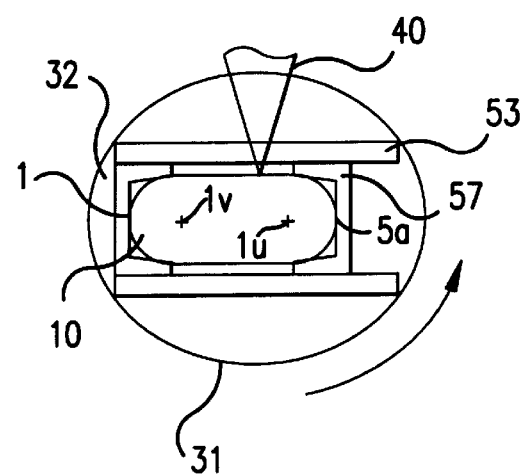
FIG. 14 is a drawing describing condition of laser welding while rotating the piezoelectric resonator in the production apparatus of the present embodiment in FIG. 10.

As explained above, the cross section of the case 1 of the piezoelectric resonator of the present invention is flattened, hence, in performing laser welding, a method and a structure is used which are slightly different from the laser welding for a case with circular cross section in order to perform high quality welding and to improve the air tightness of the welded section. In other words, if welding is performed by fixing the position of the laser beam 40 and by rotating the laser beam 40 around the central axis of the case 1 in the same manner as performing laser welding for the case with a circular cross section, the size of the spot of the laser beam 40 changes and becomes uneven throughout the welding area, resulting in poor quality welding in the welding area 5a. To explain in more detail, welding is started by adjusting the distance x between the laser head 41 and the welding area 5a as described in FIG. 12A and FIG. 12B, for example, and by matching the spot diameter in the state wherein the long side 1f of the case 1 described in FIG. 3 faces the side of the laser head 41. Then, when the short side 1e of the case 1 described in FIG. 3 faces the side of the laser head 41 as the result of rotating the case 1 around the central axis 1o, the spot diameter of the laser beam 40 changes because the distance from the welding area 5a to the laser head 41 changes due to the flattened cross section of the case 1. For example, if the state described in FIG. 13 occurs, the spot diameter of the laser beam 40 being irradiated in the welding area 5a becomes large, causing the energy density to decline and the fusion state to become unstable, which results in poor quality welding.

Moreover, if the laser beam 40 is fixed, for example, and the circular case is rotated, the laser beam 40 is irradiated from the nearly vertical direction along the outer surface of the case and moves with uniform speed. Hence, it is relatively easy to maintain welding quality by keeping the density of the laser beam to be irradiated on the welding area nearly uniform. On the other hand, the case 1 of the present embodiment has a flattened cross section as described in FIG. 11. Hence, when the case 1 is rotated around the central axis 1o, the irradiation angle of the laser beam 40 to be irradiated on the welding area 5a changes depending on the angle of rotation, and the velocity with which the spot of the laser beam 40 moves in the welding area 5a toward the circumference also changes. Hence, the density of the laser beam changes and the welding states change, causing the fusion state to be unstable and the quality of the welding is easily deteriorated. In other words, when a non-circular object is rotated, speed along the circumference becomes different with the linear section slower and the arc section being faster because the rotation is with the same angular velocity whether along the linear section or along the arc section, and dispersion occurs for trace of the laser spot and the welding easily becomes unstable. Moreover, irradiation intensity of the laser beam 40 differs depending on whether the beam enters the object vertically or with other angle, with intensity decreasing when the beam enters with other angle. Hence, when a non-circular object is rotated, though the laser beam 40 hits the object from the direction of the normal line at the arc section, when the laser beam 40 hits the linear section after rotation, the power declines due to the non-vertical angle of irradiation. Moreover, for the linear section, the angle at which the laser beam 40 hits the object varies due to rotation, hence, the laser power to be irradiated is unstable.

With the production apparatus 30 of the present invention described in FIG. 10, stable welding is achieved by irradiating nearly uniform laser beam 40 even in the welding area 5a of the case 1 with flattened non-circular cross section. Thus the dispersion of welding is prevented and elements of sealing failure are eliminated from the open edge 1b of the case 1 and the guard 4 of the hermetic terminal 2 by performing welding of uniform quality. To do this, with the production apparatus 30 of the present embodiment, a driving mechanism 50 is introduced which changes the relative position of the piezoelectric resonator 10 attached to the chuck 31 and the laser head by approximately the angle of rotation of the piezoelectric resonator 10.

The production apparatus 30 of the present embodiment will be described hereafter in greater detail. The production apparatus 30 of the present embodiment includes the main body 37 standing vertically from the table 36, and two arms 38 and 39 extending horizontally from the main body 37 as described in FIG. 10. One arm 38 is guided into inside of the vacuum chamber 60, and a chuck 31 is provided on the tip of the arm to attach the piezoelectric resonator 10. Moreover, a laser head 41 is provided on the tip of the other arm 39 to be able to irradiate the laser beam 40 in the welding area 5a in the case of the piezoelectric resonator through a glass 61 which is transparent relative to the laser beam in the vacuum chamber 60. A driving mechanism 50 is provided in the middle of each arm 38 and 39 and in the present embodiment, the driving unit 51 to drive laser head 41 and the first driving unit 52 to drive the chuck 31 are provided. Moreover, in the driving mechanism 50 of the present embodiment, the second driving unit 53 is provided in the chuck 31 which moves the piezoelectric resonator 10 in the direction perpendicular to the axis of rotation of the chuck 31. With the production apparatus 30 of the present embodiment, the chuck 31 is rotated by the first driving unit 52, and then by moving the piezoelectric resonator 10 inside the chuck 31 with the second driving unit 53 a uniform welding is achieved, which will be explained later.

Moreover, with the production apparatus 30 of the present embodiment, two hooks are provided in the grabbing unit 32 of the chuck 31 to grab the case 1 so that the case 1, in turn, may reliably grab hold of the flattened, non-circular piezoelectric resonator 10. Moreover, a suction unit 33 with a magnet is provided in the back of the grabbing unit 32 to attract case 1 to the chuck 31 by magnetic force. Hence, with the production apparatus 30 of the present embodiment, the case is securely anchored on the predetermined position of the chuck 31 and sealing failures such as shift in laser beam from the welding area 5a due to the movement of the case during the rotation or welding with inclined hermetic terminal 2 are prevented beforehand.

Moreover, the chuck 31 is provided in the vacuum chamber 60 so that the inside of the case 1 may be sealed in a vacuum state. Conventionally, the entire apparatus including the laser head and the driving mechanism is placed inside the large vacuum chamber in order to make inside of the case a vacuum. However, with the production apparatus 30 of the present embodiment, the chuck 31 is stored in the vacuum chamber 60 and the laser beam 40 is irradiated through the glass 61 which has a high transmission ratio of the laser beam 40. Hence, the vacuum chamber 60 is made compact, enabling miniaturization of the production apparatus capable of sealing the inside of the case 1 in a vacuum state. Thus, manufacturing of the piezoelectric resonator using piezoelectric vibrator which is hard to oscillate unless in a vacuum is achieved by a compact apparatus.

As described above, with the production apparatus of the present embodiment, the sealing of the case by welding may be accomplished in nitrogen or in a vacuum, which lowers the CI value (crystal impedance, or commonly known as resistance value) of the piezoelectric resonator and oscillation becomes easy. Thus, the characteristics of the piezoelectric resonator are improved. Moreover, an AT resonator such as thickness sliding resonation can oscillate in the nitrogen but the inside of the case must be kept in a vacuum state to oscillate the resonator with a high CI value such as a tuning fork type resonator with such as a bent resonation. Therefore, the production apparatus of the present embodiment can easily seal the inside of the case even for the resonators requiring maintenance of the vacuum in side the case as described above, and further, the size of entire production apparatus may be made small.

FIG. 14 through FIG. 17 describe states wherein the piezoelectric resonator 10 is moved relative to the laser beam 40 by the driving mechanism 50 in the production apparatus 30 of the present embodiment. First, when the piezoelectric resonator 10 is inserted in the grabbing unit 32 of the chuck 31 as described in FIG. 14, the case 1 is anchored by the left and the right hooks 57. Then, the grabbing unit 32 is set left of the chuck 31 in the figure by the second driving unit 53 while the case 1 is grabbed by the hook 57. By this means, one of the centers 1u of the arc i of the case 1 is set at the center of the chuck 31 and the laser beam 40 is irradiated on the arc section of the case 1 by a 180° rotation of the chuck 31 via the first driving unit 52 and the welding of the open edge 1b, and the welding area 5a to be connected to the guard 4 in arc an shape is performed.

Figure 15:
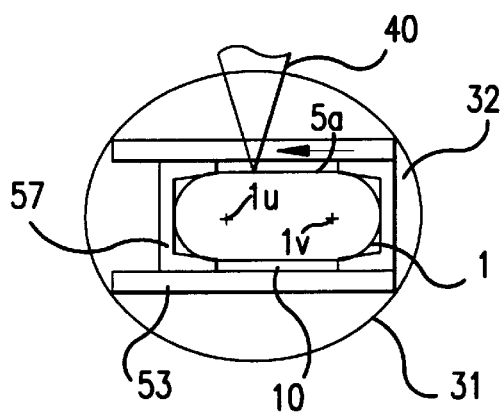
FIG. 15 is a drawing describing condition of laser welding while moving the piezoelectric resonator in the production apparatus of the present embodiment in FIG. 10.

When the chuck 31 is rotated by the first driving unit 52, the piezoelectric resonator 10 is set on the right in the figure as described in FIG. 15. Then, the piezoelectric resonator 10 is moved by the second driving unit 53 from the right to the left in the figure. By doing this, the laser beam 40 moves along the linear section of the case 1 and the welding of the open edge 1b and the welding area 5a of the guard which is connected linearly is performed.

Figure 16:
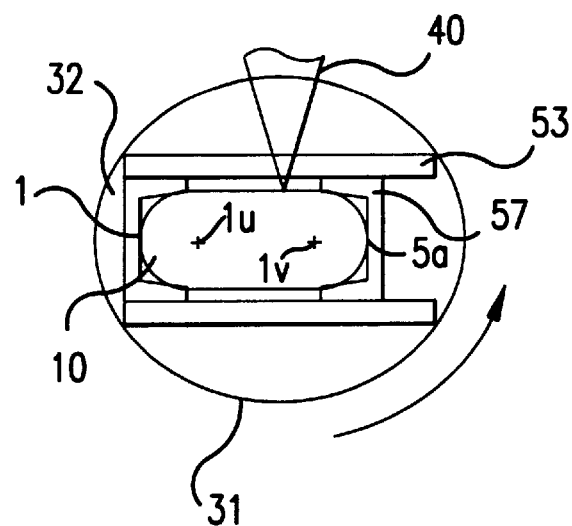
FIG. 16 is a drawing describing condition of laser welding an arc unit different from FIG. 14 while rotating the piezoelectric resonator in the production apparatus of the present embodiment in FIG. 10.
Figure 17:
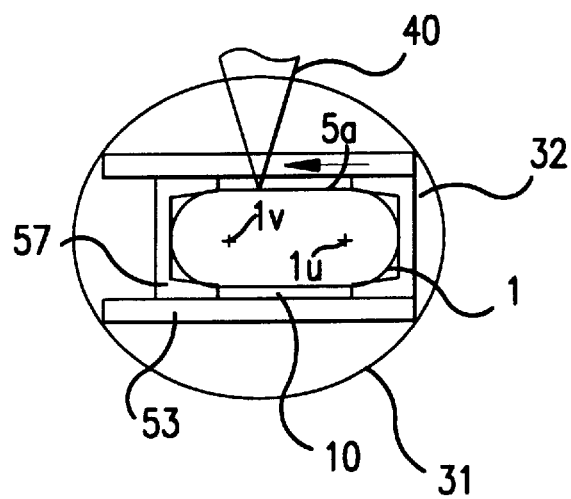
FIG. 17 is a drawing describing condition of laser welding a linear unit different from FIG. 15 while moving the piezoelectric resonator in the production apparatus of the present embodiment in FIG. 10.

When the piezoelectric resonator 10 is set on the left of the chuck 31 in the figure by the second driving unit 53, the other center 1v of the arc section in the case 1 is set in the center of the chuck 31 as described in FIG. 16. Therefore, when the chuck 31 is rotated 180° by the first driving unit 52 similar to the explanation given in FIG. 14, the other arc section of the welding area 5a is welded. Upon completion of this rotational driving, the piezoelectric resonator 10 is set on the right in the figure as described in FIG. 17. Then, when piezoelectric resonator 10 is moved linearly by the second driving unit 53 similar to FIG. 15, the welding of the other linear section of the welding area 5a is performed. Also, in the production apparatus 30 of the present embodiment, the first driving unit 52 performs only rotational driving. Hence, the arm 38 running through the vacuum chamber 60 executes only rotational movement, making the sealing of the arm 38 simple and maintaining the atmosphere inside the vacuum chamber 60 easy.

As explained above, with the production apparatus 30 of the present embodiment, the first driving unit 52 of the driving mechanism 50 performs an operation in which the piezoelectric resonator 10 is rotated, then the second driving unit 53 performs an operation in which the piezoelectric resonator 10 is moved linearly. Thus, the laser beam 40 is always irradiated from the near normal direction relative to the outer surface of the flattened case 1 and the laser power can be transmitted in stable manner to the connection section of the open edge 1b and the guard 4. Moreover, since the distance between the laser head and the outer surface of the case 1 is maintained to be constant, the size of the spot of the laser beam 40 is also maintained constant on the outer surface of the case 1. Then, by adjusting the speed of the linear driving and the rotational driving, the speed of the spot of the laser beam 40 moving along the perimeter of the case 1 can be made constant. In this manner, the production apparatus 30 of the present embodiment maintains the distance between the laser head and the open edge 1b nearly constant during laser welding and further, the angle of the laser beam 40 relative to the surface of case 1 and the speed of the spot movement of the laser beam are maintained to be nearly constant. Therefore, it is possible to maintain the welding states of the open edge 1b and the guard 4 nearly constant throughout the entire perimeter of the case 1, enabling a high quality, uniform welding. Hence, the case 1 is completely sealed by the hermetic terminal 2 and a thin piezoelectric resonator with superior oscillation characteristics can be provided.

Here, with the production apparatus of the present embodiment, the laser head is anchored and the piezoelectric resonator side is made to be anchored or moved in order to make the apparatus smaller but it is clear that a similar result as the above can be obtained by moving the laser head side opposite to the above.

Figure 18:
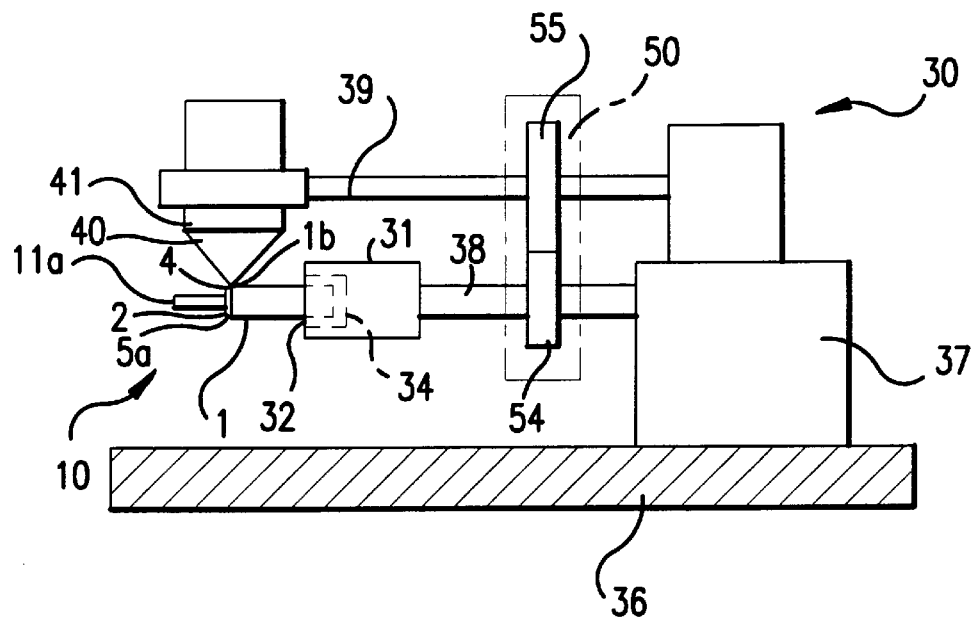
FIG. 18 is a drawing describing a production apparatus of the present invention different from the production apparatus of FIG. 10.

FIG. 18 describes an example of the production apparatus different from the above. The production apparatus 30 of the present embodiment is same as the production apparatus described above in the sense that the chuck 31 is attached on the piezoelectric resonator 10 and the laser welding is performed by irradiating the laser beam on the contour of the open edge 1b of the case 1. Hence, an explanation of the common components is omitted by simply assigning the same symbol. A cam 54 and a receiving plate 55 are mounted and combined to each of an arm 38 supporting the piezoelectric resonator 10 and the arm 39 supporting the laser head 41 in the driving mechanism 50 of the present embodiment. Hence, when the arm 38 is rotated by a rotation mechanism such as a motor in the main body 37 or in the driving mechanism 50, the laser head 41 moves linearly up and down by means of the cam 53 and the receiving plate 55 of the driving mechanism 50, which makes it possible to maintain the distance between the outer surface of the case 1 and the laser head 41.

Figure 11:
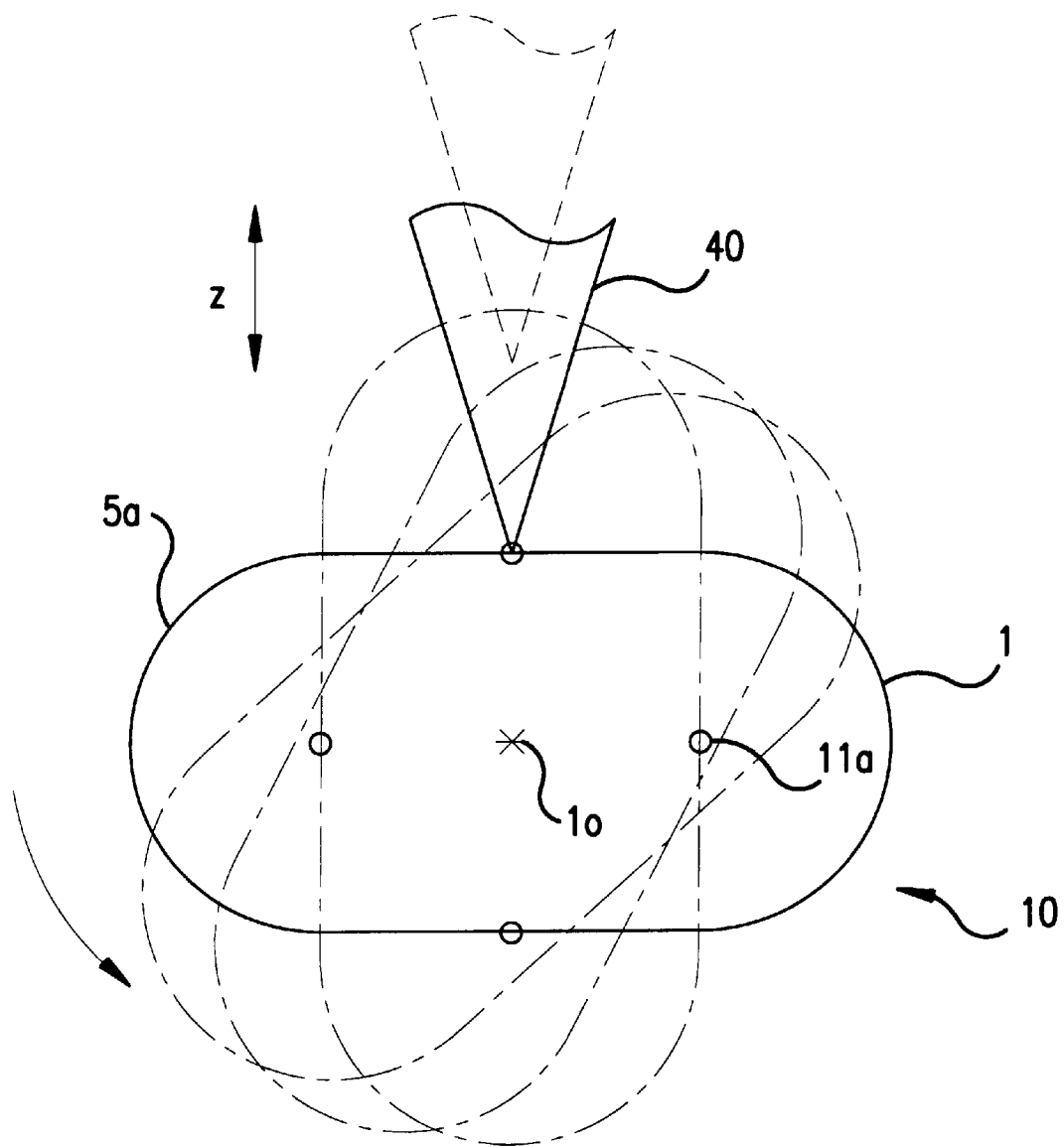
FIG. 11 is a drawing describing the relationship between a connection section to be welded and the laser beam during welding of the piezoelectric resonator in FIG. 1.

In other words, when the case 1 of the piezoelectric resonator 10 is rotated around the central axis 1o, the spot diameter of the laser beam 40 changes if the laser head 41 is anchored because the case 1 is flattened as described in FIG. 11. Hence, with the production apparatus of the present embodiment, the distance between the laser head 41 and the outer surface of the case 1 is maintained constant by moving the laser head 41 vertically in the Z direction of FIG. 11 with the rotation of the piezoelectric resonator 10, and the change in the spot diameter of the laser beam 40 is prevented. Therefore, welding is performed wherein the laser beam 40 is irradiated on the linear section and the arc section of the welding area extending the open edge 1b and the guard 4 with about the same spot diameter. Hence, the fusion in the connection section is strong, enabling welding with strong and high quality.

The shape of the cam 54 and the receiving plate 55 are such that the height changes gradually with rotation in order to match the shape of the cross section of the case 1. Moreover, as described in FIG. 11, the spot diameter of the laser beam 40 is established at the top section of the central axis 1o, and when the case 1 is rotated around the central axis the irradiation angle of the spot of the laser beam 40 relative to the case 1 changes, and if the rotation speed is constant the movement velocity of the spot of the laser beam 40 along the open edge 1b also changes. In other words, when the piezoelectric resonator 10 rotates from a position wherein the laser beam 40 irradiates nearly vertically to the long side of the case 1, the irradiation angle of the laser beam 40 relative to the case 1 cease to be vertical and the speed with which the laser beam 40 moves along the contour of the case 1 becomes faster. Here, the speed is the fastest at the arc section, after which the speed declines. Thus, the amount of energy given from the laser beam 40 to the case 1 changes, causing, after fusion by laser, the shape of the laser spot trace to be uneven and welding to be unstable.

Hence, with the production apparatus 30 of the present embodiment, the rotation speed of the piezoelectric resonator 10 is controlled by the driving mechanism 50 so that the rotation speed is reduced at the arc section where the speed of the spot of the laser beam 40 along the contour is fast, and the speed matching the irradiation angle at the linear section is obtained. Then, the distance from the laser head 41 to the welding area 5a is controlled by the cam 54 and the receiving board 55 so that the size of the spot of the laser beam 40 in the welding area 5a is maintained to be uniform. The control of the rotation speed can be accomplished easily by using a driving mechanism such as a pulse motor.

As explained above, with the production apparatus of the present embodiment, by controlling the rotation speed of the piezoelectric resonator 10 based on the speed of the spot of the laser beam 40 moving around the contour of the case 1 and an irradiation angle of the laser beam 40, the distance between the laser head and the piezoelectric resonator 10 is controlled so that the size of the spot of the laser beam 40 becomes constant in the welding area 5a. Hence, the laser beam 40 with uniform energy is always irradiated on the connection section of the open edge 1b of the piezoelectric resonator 10 and the guard 4 of the hermetic terminal 2 and stable fusion is obtained, resulting in high quality welding. Hence, a piezoelectric resonator 10 capable of maintaining air tightness inside the case 1 for a long time is provided.

Moreover, with the present embodiment, the laser head 41 is placed and moved vertically relative to the piezoelectric resonator 10, but it is clear that the laser head can be placed and moved horizontally relative to the piezoelectric resonator 10. Moreover, with the present invention the laser head side is made to move but it is obvious that the piezoelectric resonator 10 side is made to move. Moreover, the operation of the rotating laser head and the piezoelectric resonator relative to each other and the operation of moving them linearly can be accomplished by interlocking them, and the operation can be executed simultaneously or alternatively as long as the relative position of the laser head and the piezoelectric resonator is controlled. Furthermore, the mechanism to move the laser head or the piezoelectric resonator with the above-mentioned motion is not limited to a cam and the like but various control mechanisms such as stepping motors can also be used.

Moreover, the chuck 31 of the production apparatus 30 of the present embodiment includes a grabbing unit 32 which is manufactured with nearly the same shape as the case 1 of the production apparatus explained above, and the suction unit 34 to attract the case 1 inserted in the grabbing unit 32 by a vacuum device. The chuck 31 prevents the tilting or missing of the case 1 during laser welding to ensure highly reliable welding. In the suction unit 34 which attracts the case 1 by the vacuum, the removal of the piezoelectric resonator 10 in the case 1 from the chuck 31 after completion of the welding can easily be accomplished by cutting off the vacuum and supplying pressurized air.

Figure 19:
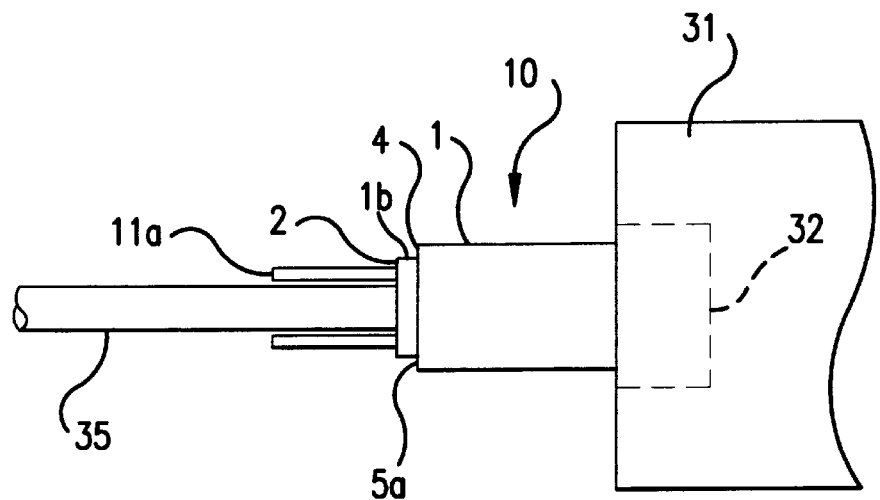
FIG. 19 is a drawing describing a condition of maintaining a piezoelectric resonator by a method different from the chuck in FIG. 10 and FIG. 18.
Figure 20:
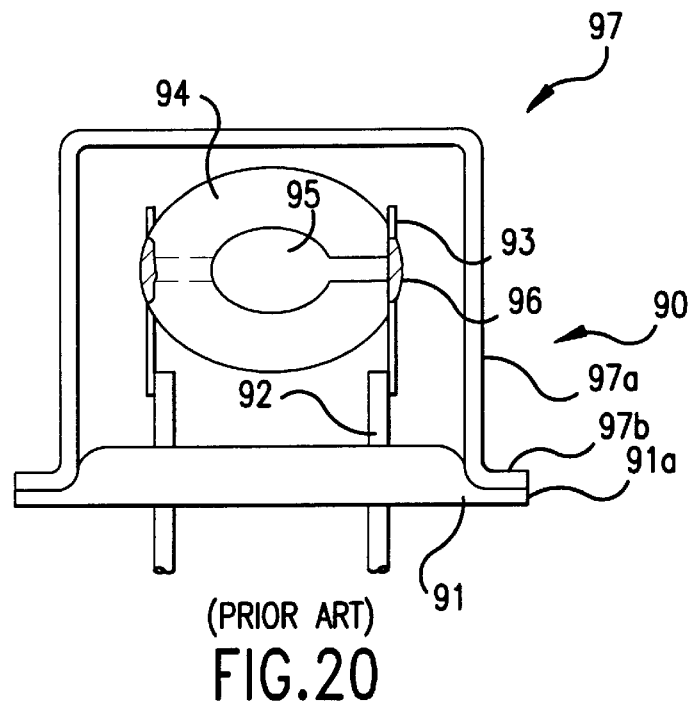
FIG. 20 is a cross-section describing a structure of a conventional piezoelectric resonator.
Figure 21:
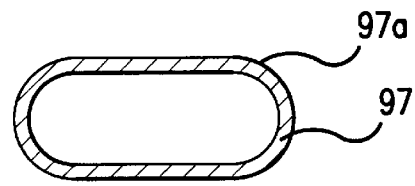
FIG. 21 is a drawing describing a cross-section of the case for the piezoelectric resonator in FIG. 20.
Figure 22:
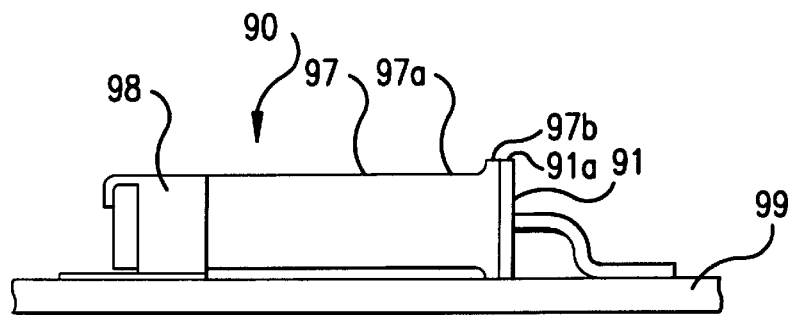
FIG. 22 is a side view describing a condition of mounting the piezoelectric resonator in FIG. 20 onto a substrate.

FIG. 19 describes a chuck 31 having a different form from that explained above. The chuck 31 of the present embodiment comprises the grabbing unit 32 to insert and grab the case 1 containing the piezoelectric resonator 10, and a press unit 35 which pushes, from the side opposite of the grabbing unit 32, the piezoelectric resonator 10 from the hermetic terminal 2 side of the piezoelectric resonator 10 to the grabbing unit 32 to prevent tilting or missing during welding. Moreover, when the piezoelectric resonator 10 is rotated, the press unit 35 composed of a push rod and the like, is also made to rotate. By adhering the piezoelectric resonator 10 to the chuck 31 during welding in this manner, the occurrence of a situation wherein the hermetic terminal 2 is attached in bent form and the piezoelectric vibrator 8 housed and attached in the case 1 is tilted relative to the case 1 is prevented.

As explained above, the preferred embodiments stated in the present specification are merely for the purpose of presenting examples and are not limiting. The scope of the present invention is described in the attached scope of claims, and all the modified examples included in the scope and the intent of the present invention are declared to remain within the scope of the claims of the present invention.

With the piezoelectric resonator of the present invention, the guard is extended from the hermetic terminal which seals the open edge of the case about the same distance as the thickness of the case and the inside of the case is sealed by welding the guard and the open edge of the case. Hence, the flattened case is sealed without a component protruding from the case outwardly, and a very thin piezoelectric resonator which can be adhered to the substrate is provided as a surface mounting device. Moreover, by using the production method and the production apparatus of the present invention, a stable, high quality welding is performed on the open edge of the case with the flattened cross section and the guard, resulting in a highly reliable and long lasting piezoelectric resonator with excellent oscillation characteristics.

Moreover, with the present invention, electrolysis plating is performed or a technique is adopted to manufacture the case and the hermetic terminal using material having the same heat expansion rate as the glass insulator in order to maintain the air tightness of the hermetic terminal and the case, and thus the inner state of the case is maintained constant and stable oscillation is achieved. Moreover, the oscillation frequency is stabilized by supporting one side of the piezoelectric vibrator by a flattened inner lead to prevent the effect of warping caused by sealing and to minimize frequency fluctuation, resulting in a piezoelectric resonator with excellent long term aging characteristics.

As explained above, the present invention provides a small, thin piezoelectric resonator having a size of no more than about 2.0×3.5 mm and with a case having a oblateness of the cross section no more than about 60%. Moreover, a piezoelectric vibrator is easily installed on the hermetic terminal and a holder and other jigs are not needed for mounting on the substrate, hence an inexpensive piezoelectric resonator is provided which is adhered and attached to the substrate. Moreover, by the production method and the apparatus of the present invention, laser power is maintained constant when the hermetic terminal and the case are sealed by welding and uniform welding is obtained.

Moreover, by attaching such a piezoelectric resonator to the lead frame which is sealed with resin, and by sealing again with resin after combining with a small, thin chip type piezoelectric resonator or IC, a small, thin piezoelectric oscillator is provided.

We claim:

1. A piezoelectric resonator comprising:
    a piezoelectric vibrator having a piezoelectric body and an electrode;
    a hollow case having an outer surface, a flattened cross section and an open edge that houses the piezoelectric vibrator; and
    a hermetic terminal which seals the open edge and leads the electrode of the piezoelectric vibrator from the case outwardly,
    the hermetic terminal comprising an insertion unit inserted in the case, and a guard having an extension extending from the insertion unit by an amount nearly equal to a thickness of the case, the extension of the guard having an outer surface such that the outer surface of the extension substantially forms a single plane with the outer surface of the case,
    the guard stopping the open edge by engaging with the open edge, and
    the open edge of the case and the guard of the hermetic terminal being sealed by welding.

2. A piezoelectric resonator of claim 1,
    the open edge of the case being bevelled towards inside.

3. A piezoelectric resonator of claim 1, the hermetic terminal further comprising a metal outer ring composing the insertion unit from which the guard protrudes, a lead running through the hermetic terminal from inside of the case outwardly, and a glass insulating unit that seals the section where the lead runs through and insulates the lead from the metal outer ring, the metal outer ring being made of at least one of KOVAR, Fe-Ni alloy and SUS, and the case being made of at least one of KOVAR, Fe-Ni alloy and SUS.

4. A piezoelectric resonator of claim 1, electrolysis plating being performed on a welding area which extends at least to the open edge and the guard out of the surface of the case and the hermetic terminal.

5. A piezoelectric resonator of claim 4, electrolysis Ni plating or Au plating on top of electrolysis Ni plating being performed as said electrolysis plating.

6. A piezoelectric resonator of claim 4, electrolysis Ni plating or Au plating on top of electrolysis Ni plating being performed on the outer surface of the case and the extension of the guard.

7. A piezoelectric resonator of claim 1, one side of the piezoelectric vibrator being supported by the hermetic terminal by means of a conductive adhesive agent.

8. A piezoelectric resonator of claim 1, the hermetic terminal further comprising a lead which guides the electrode of the piezoelectric vibrator from the case outward and a side of the lead extending toward the piezoelectric vibrator being flattened.

9. A piezoelectric resonator of claim 1, the case and the hermetic terminal having an oblateness within a range of about 40–60%, the oblateness being defined as a ratio of a minimum outer diameter and a maximum outer diameter.

10. A piezoelectric resonator comprising the piezoelectric resonator of claim 1 and a sealing resin which molds a contour of the piezoelectric resonator into a chip shape.

11. A piezoelectric oscillator comprising the piezoelectric resonator of claim 1, an IC board on which an oscillation circuit is mounted, a lead frame connected to the IC board and a sealing resin unit to seal said piezoelectric resonator, said IC board, said oscillator circuit and said lead frame.

* * * * *